(12) United States Patent
Liu et al.

(10) Patent No.: US 12,506,451 B2
(45) Date of Patent: Dec. 23, 2025

(54) POWER AMPLIFIER SYSTEM WITH A CLAMP CIRCUIT FOR PROTECTING THE POWER AMPLIFIER SYSTEM

(71) Applicant: SKYWORKS SOLUTIONS, INC., Irvine, CA (US)

(72) Inventors: Mingming Liu, Cedar Rapids, IA (US); Nathan Lucas Nuzum, Quasqueton, IA (US); Philip John Lehtola, Cedar Rapids, IA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 524 days.

(21) Appl. No.: 18/092,465

(22) Filed: Jan. 3, 2023

(65) Prior Publication Data

US 2023/0216457 A1 Jul. 6, 2023

Related U.S. Application Data

(60) Provisional application No. 63/266,486, filed on Jan. 6, 2022.

(51) Int. Cl.
 *H03F 1/30* (2006.01)
 *H03F 1/02* (2006.01)
 *H03F 3/213* (2006.01)

(52) U.S. Cl.
 CPC .......... *H03F 3/213* (2013.01); *H03F 1/0211* (2013.01); *H03F 2200/451* (2013.01)

(58) Field of Classification Search
 CPC ................ H03F 1/30; H03F 3/20; H03G 3/30
 USPC ................................................. 330/296, 285
 See application file for complete search history.

*Primary Examiner* — Henry Choe
(74) *Attorney, Agent, or Firm* — Lando & Anastasi, LLP

(57) ABSTRACT

According to at least one example of the disclosure, a power amplifier system is provided comprising an amplifying transistor configured to amplify a radio frequency signal, a bias circuit configured to provide a bias voltage to the amplifying transistor, and a clamp circuit for protecting the power amplifier system by absorbing a current flowing through the amplifying transistor when the clamp circuit is switched on. The clamp circuit is connected at a bias node between the bias circuit and the amplifying transistor and includes a clamp transistor and a clamp diode, the clamp diode having one end connected to a collector of the clamp transistor at the bias node and another end connected to a base of the clamp transistor.

20 Claims, 11 Drawing Sheets

| MB PA, DIODE+RESISTOR |||||
|---|---|---|---|---|
| | | VSWR |||
| | | 4 | 5 | 6 |
| Vcc (V) | 4.5 | PASS | PASS | PASS |
| | 5 | PASS | PASS | PASS |
| | 5.5 | PASS | FAIL | NA |
| | 6 | NA | NA | NA |

FIG.9A

| MB PA, DIVIDER CLAMP |||||
|---|---|---|---|---|
| | | VSWR |||
| | | 4 | 5 | 6 |
| Vcc (V) | 4.5 | PASS | PASS | PASS |
| | 5 | PASS | PASS | PASS |
| | 5.5 | PASS | PASS | FAIL |
| | 6 | NA | NA | NA |

FIG.9B

| MB PA, DSCRT CLAMP |||||
|---|---|---|---|---|
| | | VSWR |||
| | | 4 | 5 | 6 |
| Vcc (V) | 4.5 | PASS | PASS | PASS |
| | 5 | PASS | PASS | PASS |
| | 5.5 | PASS | PASS | PASS |
| | 6 | NA | FAIL | NA |

FIG.9C

| FREQ. (MHz) | PA WITH DIODE + RESISTOR | | PA WITH DIVIDER CLAMP | | PA WITH CLAMP DIODE + TRANSISTOR | |
|---|---|---|---|---|---|---|
| | BIAS SETTING | POWER CONSUMPTION | BIAS SETTING | POWER CONSUMPTION | BIAS SETTING | POWER CONSUMPTION |
| 1725 | 20/28 @0.68V | 55 mW | 20/28 @0.65V | 51.6 mW | 20/20 @0.7V | 47.5 mW |
| 1855 | 20/20 @0.68V | 49 mW | 20/28 @0.66V | 52.1 mW | 20/20 @0.7V | 46 mW |
| 1925 | 28/20 @0.67V | 49 mW | 20/28 @0.65V | 51.6 mW | 20/20 @0.69V | 45 mW |
| 2015 | 20/20 @0.66V | 48 mW | 20/28 @0.65V | 51.8 mW | 20/20 @0.68V | 44.9 mW |

FIG.10

POWER AMPLIFIER SYSTEM WITH A CLAMP CIRCUIT FOR PROTECTING THE POWER AMPLIFIER SYSTEM

CROSS-REFERENCE TO RELATED APPLICATIONS

This application claims priority under 35 U.S.C. § 119(e) to U.S. Provisional Patent Application Ser. No. 63/266,486, titled "POWER AMPLIFIER SYSTEM WITH A CLAMP CIRCUIT FOR PROTECTING THE POWER AMPLIFIER SYSTEM," filed Jan. 6, 2022, the entire contents of which is incorporated herein by reference for all purposes.

BACKGROUND

Field

Aspects and embodiments of the present disclosure relate to electronic systems and, in particular, to power amplifiers for use in radio-frequency electronics.

Description of the Related Technology

Power amplifiers (PAs) are used in radio-frequency (RF) communication systems to amplify RF signals for transmission via antennas. It may be advantageous to manage the power of RF-signal transmissions to prolong battery life and/or provide a suitable transmit power level. Meanwhile, since the RF PAs in a mobile device may be connected to an antenna, there may be impedance mismatches caused by environmental changes. The PA can be damaged when a load mismatch occurs, therefore the ruggedness of a PA may be an important design metric for the transmit (Tx) chain in mobile devices.

Examples of RF communication systems with one or more PAs include, but are not limited to, mobile phones, tablets, base stations, network access points, customer-premises equipment, laptops, and wearable electronics. For example, in wireless devices that communicate using a cellular standard, a wireless local area network (WLAN) standard, and/or any other suitable communication standard, a power amplifier can be used for RF-signal amplification. An RF signal can have a frequency in the range of about 30 kHz to 300 GHz, such as in the range of about 410 MHz to about 7.125 GHz for certain communications standards.

SUMMARY

In accordance with one aspect of the present disclosure, a power amplifier system is provided. The power amplifier system comprises an amplifying transistor configured to amplify a radio frequency signal, a bias circuit configured to provide a bias voltage to the amplifying transistor, and a clamp circuit for protecting the power amplifier system by absorbing a current flowing through the amplifying transistor when the clamp circuit is switched on. The clamp circuit is connected at a bias node between the bias circuit and the amplifying transistor and includes a clamp transistor and a clamp diode. The clamp diode has one end connected to a collector of the clamp transistor at the bias node and another end connected to a base of the clamp transistor.

In one aspect, the clamp circuit is configured to prevent a current from flowing into the clamp circuit when the clamp circuit is switched off.

In another aspect, the clamp circuit is configured to be switched on when a bias voltage exceeds a threshold voltage.

In accordance with a further aspect, the collector of the clamp transistor is connected between the bias node at which the bias voltage is provided and a ground.

In another aspect, the bias node is connected to a base of the amplifying transistor via a resistor.

In accordance with one example, the power amplifier system further comprises a voltage supply circuit configured to provide a supply voltage to the power amplifier system, the supply voltage having stepwise values that change periodically in relation to an output power of the power amplifier system.

In accordance with another example, the power amplifier system further comprises a diode stack circuit including a plurality of diodes, the diode stack circuit connected between a collector of the amplifying transistor and an emitter of the amplifying transistor. In one embodiment, the diode stack circuit includes a plurality of diodes connected in series, a single diode connected in parallel and in opposite direction to the plurality of diodes, and a capacitor connected in parallel to the plurality of diodes.

In accordance with another aspect of the present disclosure, a radio frequency module is provided. The radio frequency module comprises a packaging substrate configured to receive a plurality of components, and a power amplifier system implemented on the packaging substrate. The power amplifier system includes an amplifying transistor configured to amplify a radio frequency signal, a bias circuit configured to provide a bias voltage to the amplifying transistor, and a clamp circuit for absorbing a current flowing through the amplifying transistor when the clamp circuit is switched on. The clamp circuit is connected at a bias node between the bias circuit and the amplifying transistor and includes a clamp transistor and a clamp diode, the clamp diode having one end connected to a collector of the clamp transistor at the bias node and another end connected to a base of the clamp transistor.

In one example, the radio frequency module is a front-end module.

In one aspect, the clamp circuit is configured to prevent a current from flowing into the clamp circuit when the claim circuit is switched off.

In another aspect, the clamp circuit is configured to be switched on when a bias voltage exceeds a threshold voltage.

In a further aspect, the collector of the clamp transistor is connected between the bias node at which the bias voltage is provided and a ground and the bias node is connected to a base of the amplifying transistor via a resistor.

In accordance with one example, the power amplifier system further includes a voltage supply circuit configured to provide a supply voltage to the power amplifier system, the supply voltage having stepwise values that change periodically in relation to an output power of the power amplifier system.

In accordance with another example, the power amplifier system further includes a diode stack circuit including a plurality of diodes, the diode stack circuit connected between a collector of the amplifying transistor and an emitter of the amplifying transistor. In one embodiment, the diode stack circuit includes a plurality of diodes connected in series, a single diode connected in parallel and in opposite direction to the plurality of diodes, and a capacitor connected in parallel to the plurality of diodes.

In accordance with yet another aspect of the present disclosure, a mobile device is provided. The mobile device comprises a transceiver configured to generate a radio frequency signal, and a front end system including a power amplifier system configured to amplify the radio frequency signal. The power amplifier system includes an amplifying transistor configured to amplify a radio frequency signal, a bias circuit configured to provide a bias voltage to the amplifying transistor, and a clamp circuit for absorbing a current flowing through the amplifying transistor when the clamp circuit is switched on. The clamp circuit is connected at a bias node between the bias circuit and the amplifying transistor and includes a clamp transistor and a clamp diode. The clamp diode has one end connected to a collector of the clamp transistor at the bias node and another end connected to a base of the clamp transistor.

BRIEF DESCRIPTION OF THE DRAWINGS

FIGS. 4A and 4B, illustrates an example of a breakdown occurrence in power amplifier.

FIGS. 9A, 9B, and 9C illustrate examples of ruggedness-measurement results of the power-amplifier systems.

FIG. 10 illustrates an example of power consumption of the power-amplifier systems.

DETAILED DESCRIPTION

Figure 1:
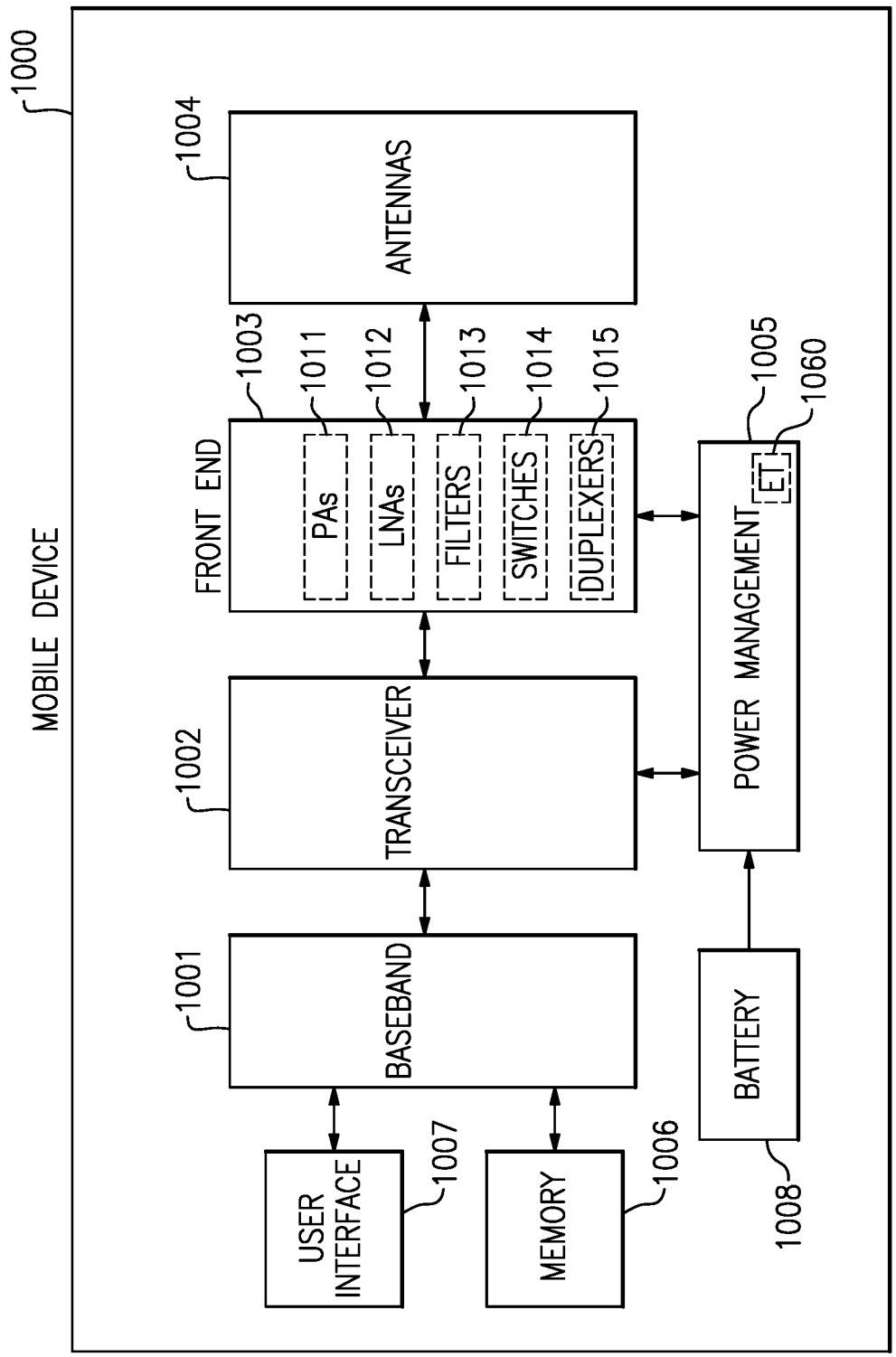
FIG. 1 illustrates a schematic diagram of one example of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 illustrates a schematic diagram of one example of a mobile device 1000. The mobile device 1000 includes a baseband system 1001, a transceiver 1002, a front-end system or module 1003, antennas 1004, a power-management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 1 as the transceiver 1002. In one example, separate components (for instance, separate circuits or dies) can be provided for handling certain types of RF signals.

The front-end module 1003 aids in conditioning signals transmitted to and/or received from the antennas 1004. In the illustrated embodiment, the front-end module 1003 includes power amplifiers (PAs) 1011, low-noise amplifiers (LNAs) 1012, filters 1013, switches 1014, and duplexers 1015. However, other implementations are possible.

For example, the front-end module 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency-Division Duplexing (FDD) and Time-Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio-frequency channel. MIMO communications benefit from higher signal-to-noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal-strength indicator.

The mobile device 1000 can operate with beamforming in certain implementations. For example, the front-end module 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 1, the baseband system 1001 is coupled to the memory 1006 to facilitate operation of the mobile device 1000.

The memory 1006 can be used for a wide variety of purposes, such as storing data and/or instructions to facilitate the operation of the mobile device 1000 and/or to provide storage of user information.

The power-management system 1005 provides a number of power-management functions of the mobile device 1000. The power-management system 1005 of FIG. 1 may include, for example, an envelope tracker 1060, but is not limited thereto. The power-management system 1005 may include a buck converter, or a buck/boost converter. As shown in FIG. 1, the power-management system 1005 receives a battery voltage from the battery 1008. The battery 1008 can be any suitable battery for use in the mobile device 1000, including, for example, a lithium-ion battery.

The mobile device 1000 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2:
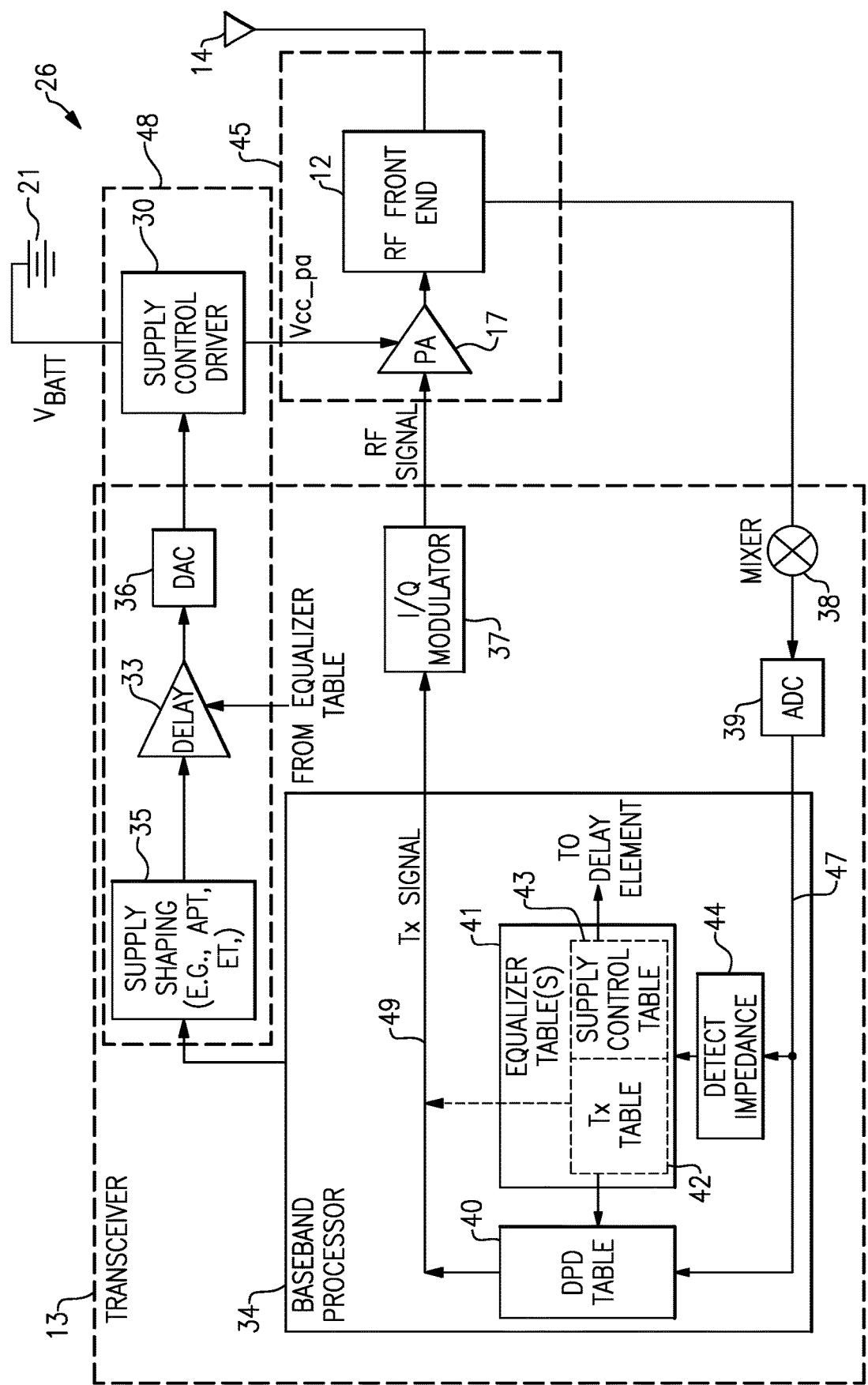
FIG. 2 illustrates a detailed block diagram of one example of a power amplifier system.

FIG. 2 illustrates a detailed block diagram of one example of a power-amplifier system 26. For example, the power-amplifier system 26 may be incorporated into the mobile device 1000. The illustrated power-amplifier system 26 includes an RF front end 12, an antenna 14, a battery 21, a supply-control driver 30, a power amplifier 17, and a transceiver 13. The illustrated transceiver 13 includes a baseband processor 34, a supply-shaping block or circuit 35, a delay component 33, a digital-to-analog converter (DAC) 36, a quadrature (I/Q) modulator 37, a mixer 38, and an analog-to-digital converter (ADC) 39. The supply-shaping block 35, delay component 33, DAC 36, and supply-control driver 30 together form a supply-shaping branch 48.

The baseband processor 34 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power-amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 17. In certain implementations, the I/Q modulator 37 can include one or more filters configured to filter frequency content of signals processed therein.

The supply-shaping block 35 can be used to convert an envelope or amplitude signal associated with the I and Q signals into a shaped power-supply control signal, such as an average-power-tracking (APT) signal or an envelope-tracking (ET) signal, depending on the example. Shaping the envelope signal from the baseband processor 34 can aid in enhancing performance of the power-amplifier system 26. In certain implementations, such as where the supply-shaping block 35 is configured to implement an envelope-tracking function, the supply-shaping block 35 may be a digital circuit configured to generate a digital shaped-envelope signal, and the DAC 36 is used to convert the digital shaped-envelope signal into an analog shaped-envelope signal suitable for use by the supply-control driver 30. However, in other implementations, the DAC 36 can be omitted in favor of providing the supply control driver 30 with a digital envelope signal to aid the supply control driver 30 in further processing of the envelope signal.

Figure 8B:
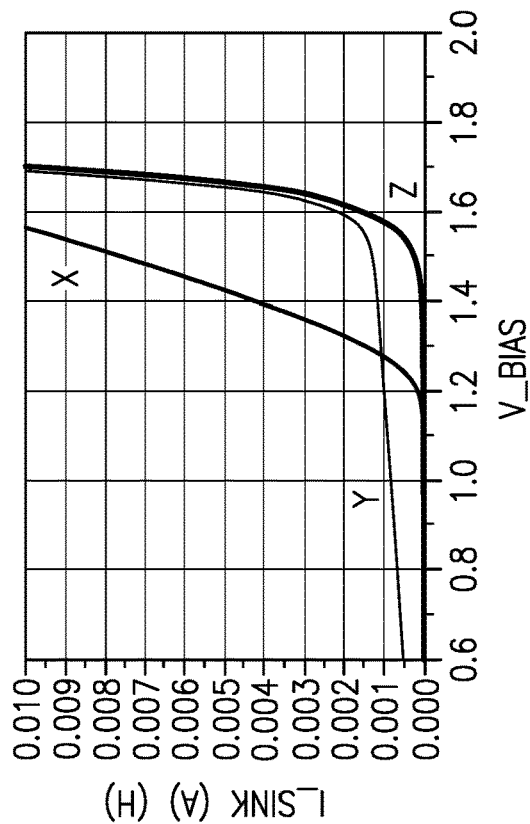
FIGS. 8A and 8B illustrate examples of I-V curves of power-amplifier systems.
Figure 8A:
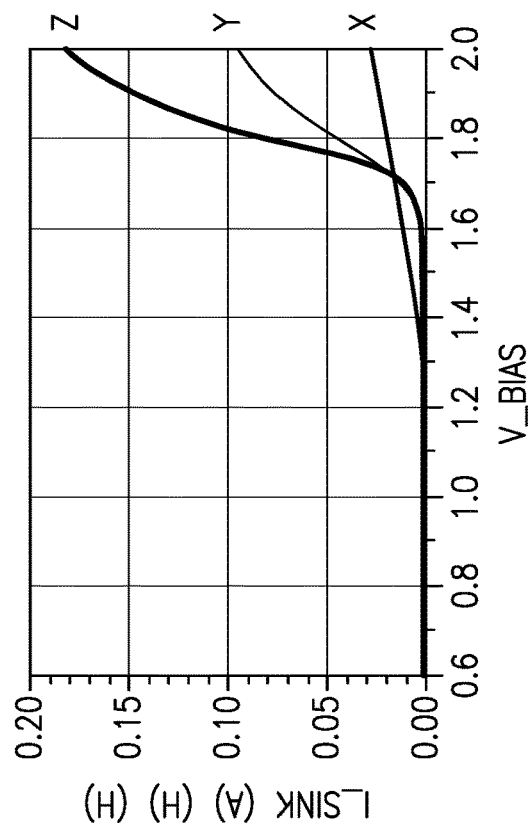

The supply control driver 30 can receive the supply-control signal (for example, an analog shaped-envelope signal or APT signal) from the transceiver 13 and a battery voltage VBATT from the battery 21, and can use the supply-control signal to generate a power-amplifier supply voltage VCC_PA for the power amplifier 17 which changes in relation to the transmit signal. The power amplifier 17 can receive the RF transmit signal from the I/Q modulator 37 of the transceiver 13, and can provide an amplified RF signal to the antenna 14 through the RF front end 12. In other cases, a fixed power-amplifier supply voltage VCC_PA is provided to the power amplifier 17. In some examples, one or more of the supply-shaping block 35, the DAC 36, or the supply-control driver 30 may not be included. Example waveforms of power-amplifier supply voltage VCC_PA and corresponding RF transmit signals are shown in FIGS. 8A, 8B, and 8C for fixed supply, APT, and ET power-supply-control operations, respectively. In some examples, the power-amplifier system 26 is capable of performing two or more supply-control techniques. For instance, the power-amplifier system 26 allows for selection (for example, via firmware programming or other appropriate mechanism) of two or more of ET, APT, or fixed-power supply control modes. In such cases, the baseband processor or other appropriate controller or processor may instruct the supply-shaping block 35 to enter into a selected mode.

The delay component 33 implements a selectable delay in the supply control path. As will be described in further detail, this can be useful in some cases for compensating for non-linearities and/or other potential sources of signal degradation. The illustrated delay component is shown in the digital domain as part of the transceiver 13, and may comprise a FIFO or other type of memory-based delay element. However, the delay component 33 can be implemented in any appropriate fashion, and in other embodiments may be integrated as part of the supply-shaping block 35, or may be implemented in the analog domain, after the DAC 36, for example.

The RF front end 12 receives the output of the power amplifier 17, and can include a variety of components including one or more duplexers, switches (for example, formed in an antenna switch module), directional couplers, and the like.

The directional coupler(s) (not shown) within the RF front end 12 can include a dual directional coupler or other appropriate coupler or other device capable of providing a sensed output signal to the mixer 38. According to certain embodiments, including the illustrated example, the directional coupler is capable of providing both incident and reflected signals (for example, forward and reverse power) to the mixer 38. For instance, the directional coupler can have at least four ports, which may include an input port configured to receive signals generated by the power amplifier 17, an output port coupled to the antenna 14, a first measurement port configured to provide forward power to the mixer 38, and a second measurement port configured to provide reverse power to the mixer 38.

The mixer 38 can multiply the sensed output signal by a reference signal of a controlled frequency (not illustrated in FIG. 2) to downshift the frequency spectrum of the sensed output signal. The downshifted signal can be provided to the ADC 39, which can convert the downshifted signal to a feedback signal 47 in a digital format suitable for processing by the baseband processor 34. As will be discussed in further detail, by including a feedback path between the output of the power amplifier 17 and an input of the baseband processor 34, the baseband processor 34 can be configured to dynamically adjust the I and Q signals and/or power-control signal associated with the I and Q signals to optimize the operation of the power-amplifier system 26. For example, configuring the power-amplifier system 26 in this manner can aid in controlling the power-added efficiency (PAE) and/or linearity of the power amplifier 17. The mixer 38, ADC 39, and/or other appropriate components may generally perform a quadrature (I/Q) demodulation function in some embodiments.

Although the power-amplifier system 26 may include a single power amplifier in some examples, the teachings herein are applicable to power-amplifier systems including multiple power amplifiers, including, for example, multi-mode power-amplifier systems.

Additionally, although FIG. 2 illustrates a particular configuration of a transceiver, other configurations are possible, including for example, configurations in which the transceiver 13 includes more or fewer components and/or a different arrangement of components.

As shown the baseband processor 34 can include a digital pre-distortion (DPD) table 40, an equalizer table 41, and a complex-impedance detector 44. The DPD table 40 may be stored in a non-volatile memory (for example, flash memory, read-only memory (ROM), and so forth) of the transceiver 13 which is accessible by the baseband processor 34. According to some examples, the baseband processor 34 accesses entries in the DPD table 40 to aid in linearizing the power amplifier 17. For instance, the baseband processor 34 may select appropriate entries in the DPD table 40 based on the sensed feedback signal 47, and adjust the transmit signal accordingly, prior to outputting the transmit signal to the I/Q modulator 37. For example, DPD can be used to compensate for certain nonlinear effects of the power amplifier 17 including, for example, signal-constellation distortion and/or signal-spectrum spreading. According to certain examples including the illustrated example, the DPD table 40 implements memoryless DPD, for example, where the current output of the DPD-corrected transmit signal depends only on the current input.

Meanwhile, at least because power efficiency of a mobile device may be increased, different power-management modes can be selectively adapted. For example, a high-power mode, a medium-power mode, and a low-power mode can be adapted. The number of different power-management modes is not limited thereto.

In various examples, a PA in a handset may be configured to withstand extreme input power, output load VSWRs up to 6:1, extreme temperatures (−30/85° C.) under supply voltage (for example, 5.5 V), and so forth. Ruggedness under cold temperatures (for example, less than −30° C.) may be an important metric at least because voltage breakdown may be more likely at cold temperatures. For example, because there is a positive temperature coefficient on voltage breakdown, lower temperatures may have lower breakdown voltages. Also, lower temperatures may have lower losses in the post-PA matching, filtering, and/or switching components, which may result in a higher VSWR that can be presented to the PA. A failure in ruggedness may cause permanent damage to the PA and/or malfunction of the mobile device.

Voltage breakdown may be a key mechanism that causes PA ruggedness failures. The ruggedness of PA is related to the maximum supply voltage and the maximum voltage swings that the PA experiences. For example, a Class E common-emitter PA operating on a supply voltage (Vcc) of 5.5 V may push an HBT process to the limit. Ideally, a Class E PA has a maximum voltage between the collector and the emitter ($V_{CE}$) of 3.56×Vcc V under nominal operating conditions. In this example, $V_{CE}$ would be more than 19 V with no added protection. $V_{CE}$ peaks may be exaggerated over load mismatch and temperature. Accordingly, low temperatures, high Vcc, high power in (Pin), and/or high VSWR may adversely impact voltage breakdown.

Figure 3:
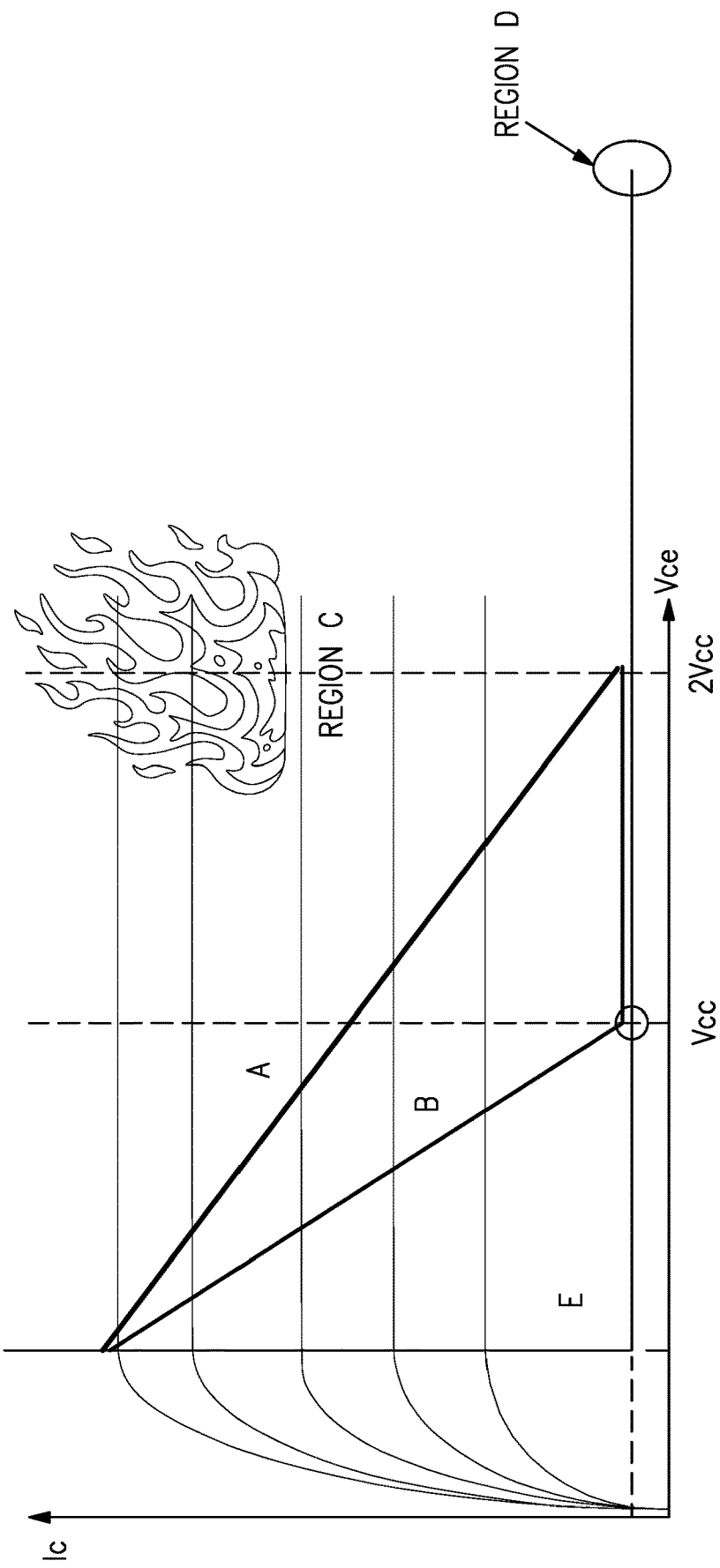
FIG. 3 illustrates an example of I-V curves for different classes of power amplifiers.

FIG. 3 illustrates an example of I-V curves for different classes of power amplifiers.

In FIG. 3, line A represents an I-V curve of a class A power amplifier, line B represents an I-V curve of a class B power amplifier, and line E represents an I-V curve of a class E power amplifier. The region C in FIG. 3 represents an area with increased power dissipation. Region D in FIG. 3 represents an area with an increased likelihood of voltage breakdown.

As shown in FIG. 3, class E stays away from the high-power dissipation quadrant of the I-V curves. However, the maximum $V_{CE}$ for a class E power amplifier (for example, 3.56×Vcc) may be relatively high. A class E power amplifier operating on the maximum $V_{CE}$ may therefore be vulnerable to voltage-breakdown failures.

Figure 4:
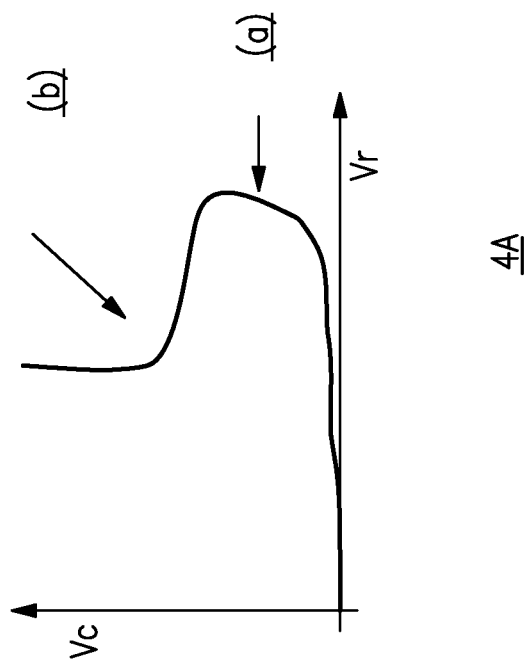
FIG. 4, which includes
Figure 4:
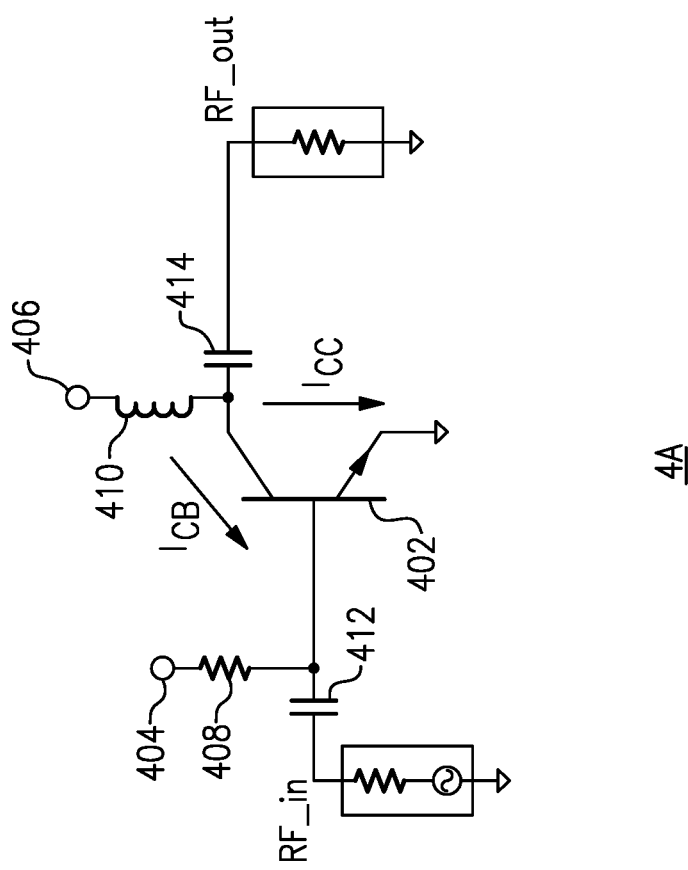

FIG. 4, which includes FIG. 4A and FIG. 4B, illustrates an example of breakdown occurrence in a power amplifier.

FIG. 4A illustrates an example schematic diagram of a power-amplifier system with a common emitter. The power-amplifier system includes a driver transistor 402 connected to a bias node 404 and a voltage-supply node 406. The bias node 404 is connected to a base of the driver transistor 402 via a resistor 408, and the voltage-supply node 406 is connected to a collector of the driver transistor 402 via an inductor 410. The base of the driver transistor 402 is coupled to an input node via an input capacitor 412, and the collector of the driver transistor 402 is coupled to an output node via an output capacitor 414.

FIG. 4B shows an example of an I-V curve for the common-emitter power-amplifier system of FIG. 4A at breakdown. The region (a) of FIG. 4B represents a first breakdown, and the region (b) of FIG. 4 represents a second breakdown.

As Vcc increases, the base-collector junction of the driver transistor 402 starts to break down causing a low impedance from the collector to the base of the driver transistor 402. As such, a current through the collector-emitter (Icc) at the driver transistor 402 starts to flow, but is relatively small. This situation may be referred to as the first breakdown. In the first breakdown, a risk of damage to the mobile device may be low.

During the first breakdown, due to thermal effects, the current through the collector-base ($I_{CB}$) at the driver transistor 402 starts to be injected into the base-emitter junction of the driver transistor 402, causing the second breakdown. In the second breakdown, Icc increases and may damage the mobile device. For example, the mobile device may be damaged from power dissipation. Accordingly, a risk of damage to the mobile device from excess heat may be increased in the second breakdown.

Therefore, it may be advantageous to protect the transistor in a common-emitter configuration from high dissipation by preventing the power amplifier from entering the second breakdown to improve ruggedness of the power amplifier.

Power-amplifier systems with a clamp circuit for protecting the power amplifier system are provided herein. Implementation of the clamp circuit may enable ruggedness performance of a power-amplifier system to be improved without substantially adversely impacting the linearity of APT performance and low power mode (LPM) power consumption. In one example, the ruggedness performance can be improved from failing at 5.5V to passing at 5.5V with margin. In some examples, the ruggedness performance can also be improved without sacrificing ET performance.

Figure 5:
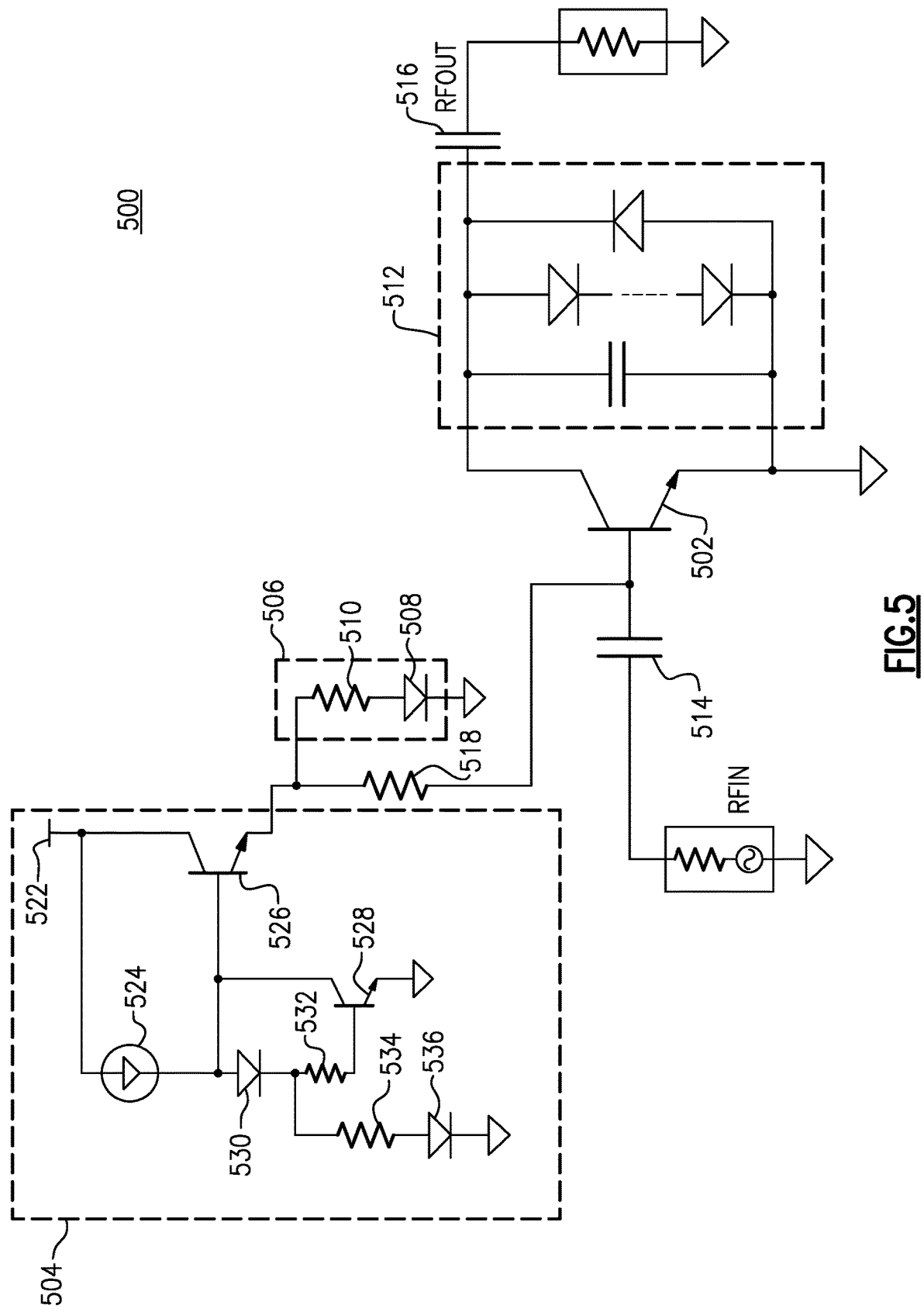
FIG. 5 illustrates an example of a power-amplifier system with a bleed circuit including a bleed diode and a bleed resistor.

FIG. 5 illustrates an example of a power-amplifier system 500 with a bleed circuit 506 including a bleed diode 508 and a bleed resistor 510. In this example, the power-amplifier system 500 includes an amplifying transistor 502 and a bias circuit 504.

The amplifying transistor 502 is coupled to an input of the radio-frequency signal. More specifically, a base of the amplifying transistor 502 is coupled to an input of the radio-frequency signal via an input capacitor 514.

The bias circuit 504 is configured to provide a bias voltage at a bias node. The bias node is connected to the base of the amplifying transistor 502 via a bias resistor 518. As shown in FIG. 5, the bias circuit 504 includes a voltage source ($V_{BATT}$) 522, a current source ($I_{REF}$) 524, and a bias transistor 526 (also referred to as a first transistor 526). The $V_{BATT}$ 522 is connected to a collector of the first transistor 526. The $I_{REF}$ 524 is connected between the $V_{BATT}$ 522 and a base of the first transistor 526. The base of the first transistor 526 is connected to a collector of a second transistor 528. A series connection of a diode 530 and a resistor 532 is connected between the base of the first transistor 526 and a base of the second transistor 528. As shown in FIG. 5, the bias circuit 504 may include another series connection of resistor 534 and diode 536.

The power-amplifier system 500 includes a stack of diodes 512 connected between a collector and emitter of the amplifying transistor 502. The stack of diodes 512 includes a series connection of diodes, a single diode in an opposite direction to the series connection of diodes, and a capacitor connected in parallel with the series connection of diodes and the single diode. One end of the stack of diodes 512 is connected to an output node via an output capacitor 516.

The bleed circuit 506 is connected to the bias node. More specifically, the bleed circuit 506 has one end connected to the bias node and the other end connected to a reference node (for example, ground). The bleed circuit 506 includes a bleed diode 508 and a bleed resistor 510. The bleed diode 508 and the bleed resistor 510 are connected in series. More specifically, the bleed resistor 510 is connected between the bias node and an anode of the bleed diode 508, and a cathode of the bleed diode 510 is connected to a ground.

According to one example, the bleed circuit 506 starts to pull out current from the base of the amplifying transistor 502. Since the bleed circuit 506 presents constant low impedance to the bias node, the current can be prevented from flowing into the emitter of the amplifying transistor 502. In one example, the bleed resistor 510 has a resistance less than or equal to 20 Ohms for a 2-mA current draw. In this manner, the second breakdown can be avoided by pulling out the current from the base of the amplifying transistor 502.

However, the impedance of the bleed circuit 506 may be present throughout operation. That is, there is current draw even in a normal operation that sacrifices AMPM performance in APT mode due to current through the bleed resistor 510 and RF voltage mitigation on the bias node. In addition, LPM power consumption may be adversely affected. Examples provided herein therefore improve ruggedness without substantially impacting APT linearity, and vice versa.

Figure 6:
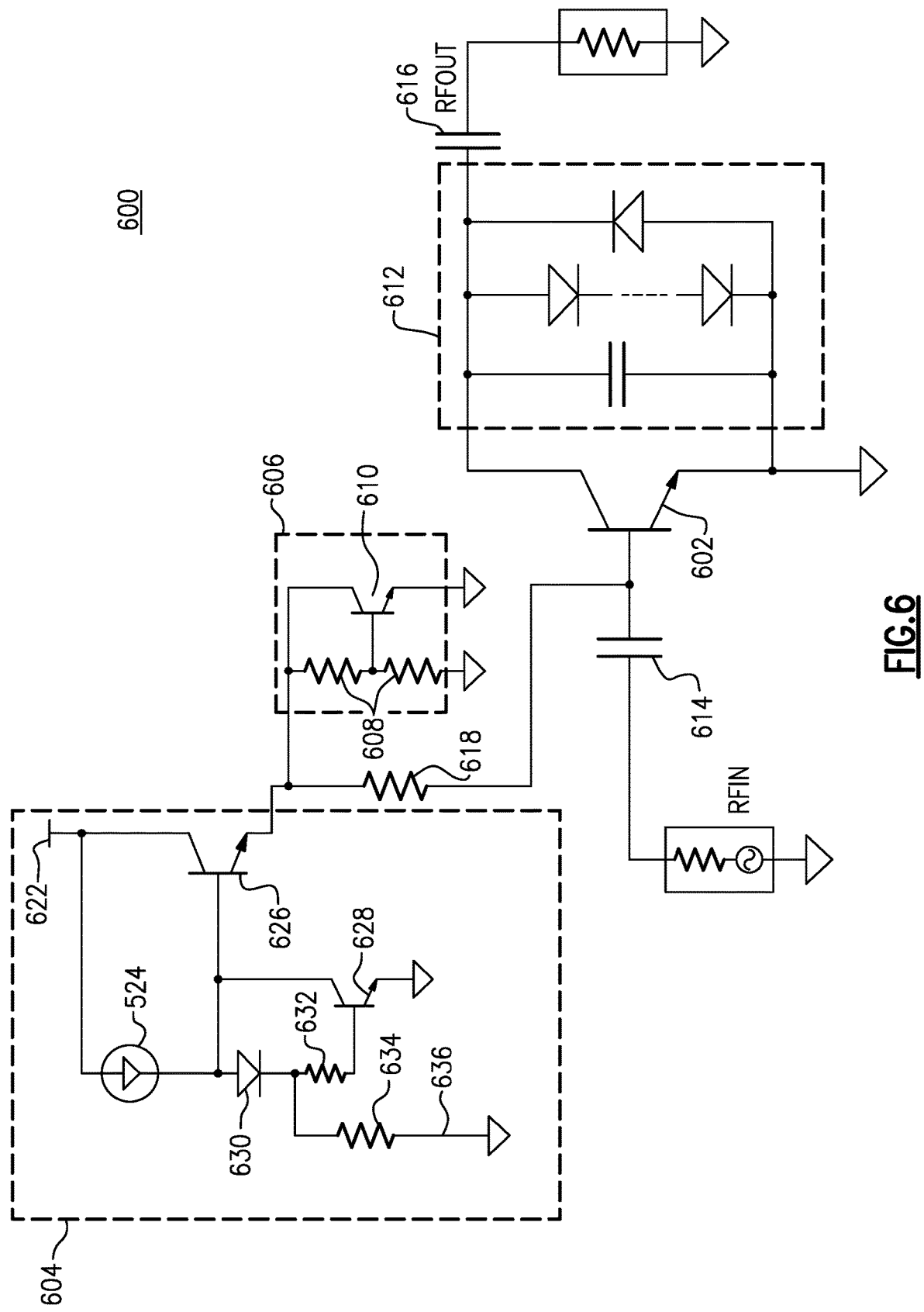
FIG. 6 illustrates an example of a power-amplifier system with a clamp bleed circuit including a voltage divider and a clamp transistor.

FIG. 6 illustrates an example of a power-amplifier system 600 with a clamp bleed circuit 606 including a voltage divider 608 and a clamp transistor 610. In this example, the power-amplifier system 600 includes an amplifying transistor 602 and a bias circuit 604.

The amplifying transistor 602 is coupled to an input of the radio-frequency signal. More specifically, a base of the amplifying transistor 602 is coupled to an input of the radio-frequency signal via an input capacitor 614.

The bias circuit 604 is configured to provide a bias voltage at a bias node. The bias node is connected to the base of the amplifying transistor 602 via a bias resistor 618. As shown in FIG. 6, the bias circuit 604 includes a voltage source ($V_{BATT}$) 622, a current source ($I_{REF}$) 524, and a bias transistor 626 (also referred to as a first transistor 626). The $V_{BATT}$ 622 is connected to a collector of the first transistor 626. The $I_{REF}$ 524 is connected between the $V_{BATT}$ 622 and a base of the first transistor 626. The base of the first transistor 626 is connected to a collector of a second transistor 628. A series connection of a diode 630 and a resistor 632 is connected between the base of the first transistor 626 and a base of the second transistor 628. As shown in FIG. 6, the bias circuit 604 may include another resistor 634 connected between a node of the series connection of the diode 630 and the resistor 632 and a reference node (for example, ground).

The power-amplifier system 600 includes a stack of diodes 612 between a collector and emitter of the amplifying transistor 602. The stack of diodes 612 includes a series connection of diodes, a single diode in an opposite direction to the series connection of diodes, and a capacitor connected to the series connection of diodes and the single diode in parallel. One end of the stack of diodes 612 is connected to an output node via an output capacitor 616.

The clamp bleed circuit 606 is connected to the bias node. More specifically, the clamp bleed circuit 606 has one end connected to the bias node and the other end connected to a reference node (for example, ground). The clamp bleed circuit 606 includes a voltage divider 608 and a clamp transistor 610. The voltage divider 608 includes a series connection of two resistors and a connection node between the two resistors. The voltage divider is configured to divide voltage at a collector of the clamp transistor 610 into a voltage at a base of the clamp transistor 610. More specifically, the node of voltage divider 608 is connected to a base of the clamp transistor 610. One end of the voltage divider 608 is connected to the collector of the clamp transistor 610, and the other end of the voltage divider 608 is connected to a reference node (for example, ground).

According to an example, the clamp bleed circuit 606 starts to pull out current from the base of the amplifying transistor 602 when the clamp bleed circuit 606 is switched on. When the clamp bleed circuit 606 is switched on, the clamp bleed circuit 606 presents low impedance. The output impedance can be determined by the size of the clamp transistor 610. In this example, the turn-on voltage of the clamp bleed circuit 606 is tunable by voltage divider 608. In this manner, the second breakdown can be avoided by pulling out the current from the base of the amplifying transistor 602.

However, since certain current also flows into the voltage divider 608, RF voltage may be reduced at the bias node, AMPM performance may be adversely impacted in APT mode. In addition, LPM power consumption may be adversely impacted.

Figure 7:
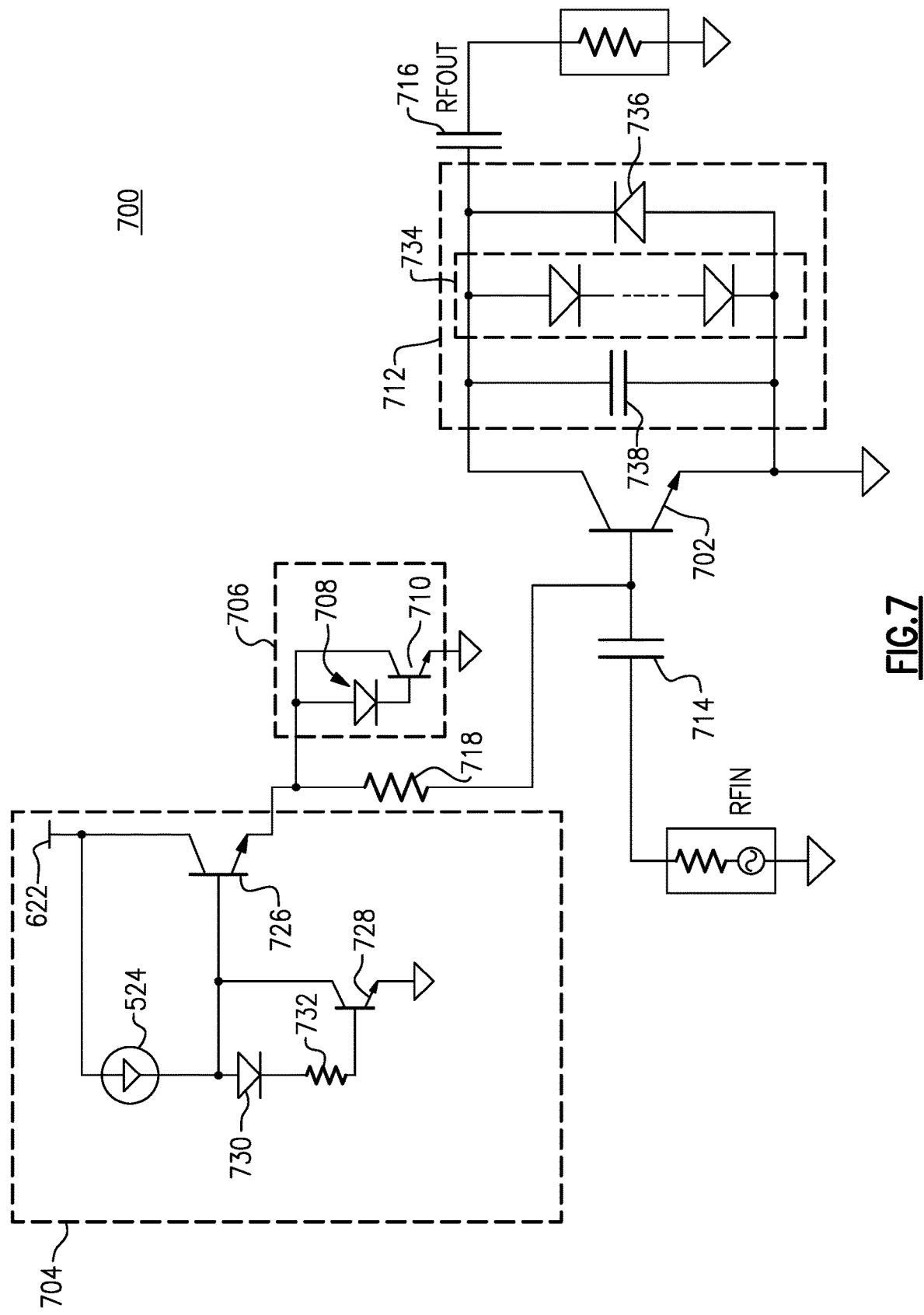
FIG. 7 illustrates an example of a power-amplifier system with a clamp circuit including a clamp diode and a clamp transistor.

FIG. 7 illustrates an example of a power-amplifier system 700 with a clamp circuit 706 including a clamp diode 708 and a clamp transistor 710. The power-amplifier system 700 includes an amplifying transistor 702 and a bias circuit 704. According to an example, the power-amplifier system 700 may be a class-E amplifier. Class-E amplifiers are highly efficient, tuned-switching power amplifiers used at radio frequencies. Class-E amplifiers use a single-pole switching element and a tuned reactive network between the switch and the load.

The amplifying transistor 702 is coupled to an input of the radio-frequency signal. The amplifying transistor 702 is configured to amplify the radio-frequency signal. More specifically, a base of the amplifying transistor 702 is coupled to an input of the radio-frequency signal via an input capacitor 714.

The bias circuit 704 is configured to provide a bias voltage to the amplifying transistor 702 at a bias node. The bias node is connected to the base of the amplifying transistor 702 via a bias resistor 718. As shown in FIG. 7, the bias circuit 704 includes a voltage source ($V_{BATT}$) 622, a current source ($I_{REF}$) 524, and a bias transistor 726 (also referred to as a first transistor 726). The $V_{BATT}$ 622 is connected to a collector of the first transistor 726. The $I_{REF}$ 524 is connected between the $V_{BATT}$ 622 and a base of the first transistor 726. The base of the first transistor 726 is connected to a collector of a second transistor 728. A series connection of a diode 730 and a resistor 732 is connected between the base of the first transistor 726 and a base of the second transistor 728.

The power-amplifier system 700 includes a stack of diodes 712 between a collector and emitter of the amplifying transistor 702. The stack of diodes 712 includes a series connection of diodes 734, a single diode 736 in an opposite direction to the series connection of diodes, and a capacitor 738 connected to the series connection of diodes 734 and the single diode 736 in parallel. The series connection of diodes 734 is configured to improve PA ruggedness at least in part by directly clamping the voltage peaks at the collector of the PA. One end of the stack of diodes 712 is connected to an output node via an output capacitor 716.

The clamp circuit 706 is configured to absorb a current flowing through the collector-base of the amplifying transistor 702 during voltage breakdown. Thus, the clamp circuit 706 prevents the collector-base current from flowing through the base-emitter junction of the amplifying transistor 702, thereby enhancing the breakdown voltage. The clamp circuit 706 is connected to the bias node. More specifically, the clamp circuit 706 has one end connected to the bias node and the other end connected to a reference node (for example, ground). That is, the clamp circuit 706 is connected between the bias node between the bias circuit 704 and the amplifying transistor 702 and a reference node (for example, ground).

The clamp circuit 706 includes the clamp diode 708 and the clamp transistor 710. The clamp diode 708 has one end connected to a collector of the clamp transistor 710 at the bias node and another end connected to a base of the clamp transistor 710. The collector of the clamp transistor 708 is connected to the bias node at which the bias voltage is provided. The bias node is connected to a base of the amplifying transistor 702 via a bias resistor 718. The clamp diode 708 may have a low threshold voltage.

The clamp circuit 706 is configured to be switched on when a bias voltage exceeds a threshold voltage. When switched on, the clamp circuit 706 presents even lower impedance at the bias node, since there is no resistance between the bias node and the collector of the clamp transistor 710.

The clamp circuit 706 may be turned off during a normal operation. When switched off, the clamp circuit 706 does not absorb any current from the bias node, because both the clamp diode 708 and the clamp transistor 710 do not operate when they are turned off. That is, the clamp circuit 706 prevents the current from flowing into the clamp circuit 706 when switched off. Therefore, the clamp circuit 706 does not consume current during normal operation (or consumes negligible current), and the LPM power consumption can be reduced.

The power-amplifier system 700 further includes a voltage-supply circuit (now shown) configured to provide a supply voltage to the power-amplifier system 700. The voltage-supply circuit may operate in APT mode. The supply voltage has stepwise values that may change periodically in relation to an output power of the power-amplifier system 700.

According to an embodiment, the clamp circuit 700 is configured to present high impedance in low- and medium-power regions and turn on only at deep saturation. Accordingly, the clamp circuit 706 may not affect the APT performance while avoiding the second breakdown at the amplifying transistor 702. In addition, the clamp circuit 706 provides a regulated voltage swing on the bias node to further protect the base of amplifying transistor 702.

FIGS. 8A and 8B illustrate examples of I-V curves of the power-amplifier systems 500, 600, 700. Line X represents an I-V curve of the power-amplifier system 500 with a bleed circuit 506 including a bleed diode 508 and a bleed resistor 510. Line Y represents an I-V curve of the power-amplifier system 600 with a clamp bleed circuit 606 including a voltage divider 608 and a clamp transistor 610. Line Z represents an I-V curve of the power-amplifier system 700 with a clamp circuit 706 including a clamp diode 708 and a clamp transistor 710.

FIG. 8A illustrates the I-V curves X, Y, Z in a wider range of current absorbed into the bleed circuit (I_SINK), and FIG. 8B shows the I-V curves X, Y, Z in a narrower range of I_SINK. That is, FIG. 8B shows a zoomed-in graph in a narrower range of values along the Y-axis.

As indicated by the I-V curve Z in FIG. 8A, the power-amplifier system 700 with a clamp circuit 706 including a clamp diode 708 and a clamp transistor 710 provides the highest current slope indicating the lowest impedance once turned on.

As indicated by the I-V curve Z in FIG. 8B, the power-amplifier system 700 with a clamp circuit 706 including a clamp diode 708 and a clamp transistor 710 does not consume current under normal conditions.

According to an example, the clamp circuit 706 enables not only avoiding the second breakdown at the amplifying transistor 702, but also maintaining linearity of APT performance and LPM power consumption without causing degradation of AMPM performance.

FIGS. 9A, 9B, and 9C illustrate examples of ruggedness-measurement results of the power-amplifier systems 500, 600, 700.

FIG. 9A illustrates the ruggedness-measurement result of the power-amplifier system 500 with a bleed circuit 506 including a bleed diode 508 and a bleed resistor 510.

FIG. 9B illustrates the ruggedness-measurement result of the power-amplifier system 600 with a clamp bleed circuit 606 including a voltage divider 608 and a clamp transistor 610.

FIG. 9C illustrates the ruggedness-measurement result of the power-amplifier system 700 with a clamp circuit 706 including a clamp diode 708 and a clamp transistor 710.

As shown throughout FIGS. 9A-9C, the power-amplifier system 700 with a clamp circuit 706 including a clamp diode 708 and a clamp transistor 710 improves the ruggedness performance from failing before/at 5.5 V of Vcc to passing at 5.5 V of Vcc.

In case that a desired specification is 5.5 V of supply voltage (Vcc), only the power-amplifier system 700 with a clamp circuit 706 including a clamp diode 708 and a clamp transistor 710 may satisfy the desired specification.

FIG. 10 illustrates an example of power consumption of the power-amplifier systems 500, 600, 700. As shown in FIG. 10, the power-amplifier system 700 with a clamp circuit 706 including a clamp diode 708 and a clamp transistor 710 helps save LPM power consumption since the clamp circuit consumes no current under normal condition.

Figure 11A:
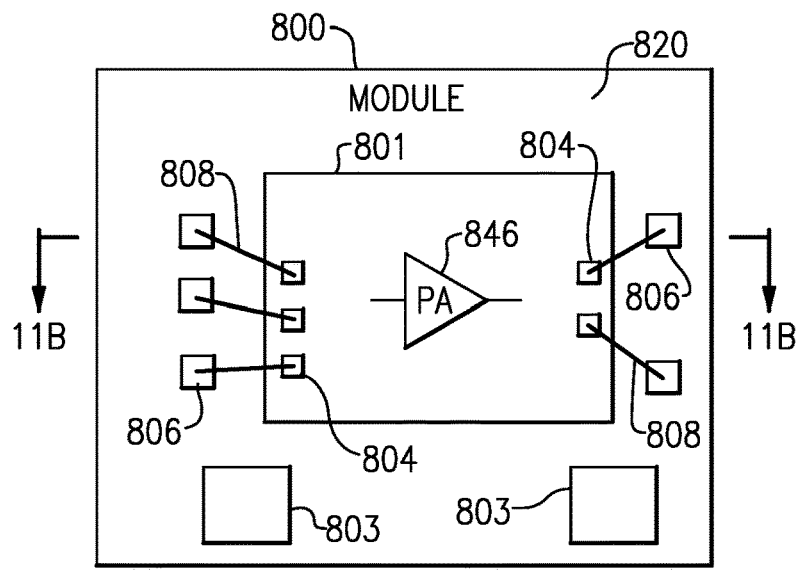
FIG. 11A illustrates a schematic diagram of one embodiment of a packaged module.
Figure 11B:
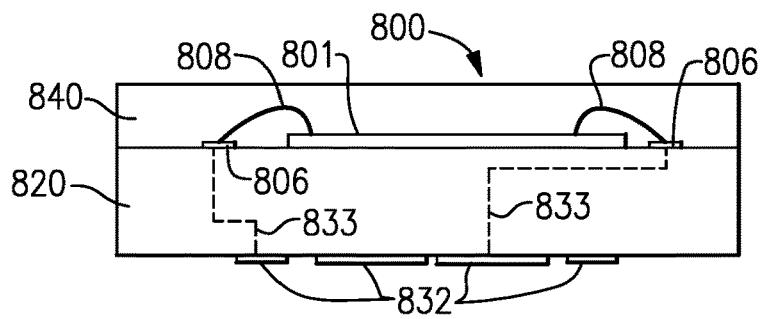
FIG. 11B illustrates a schematic diagram of a cross-section of the packaged module of FIG. 11A taken along the lines 11B-11B.

FIG. 11A illustrates a schematic diagram of one example of a packaged module 800. FIG. 11B illustrates a schematic diagram of a cross-section of the packaged module 800 of FIG. 11A taken along the lines 11B-11B.

The packaged module 800 includes an IC or die 801, surface-mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a power-amplifier system, such as the power-amplifier system 500, 600, 700, which can be implemented in accordance with any of the example discussed herein.

The packaging substrate 820 can be configured to receive a plurality of components such as the die 801 and the surface-mount components 803, which can include, for example, surface-mount capacitors and/or inductors.

As shown in FIG. 11B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface-mount components 803. As shown in FIG. 11B, the electrical connections between the contact pads 832 and the die 801 can be facilitated by connections 833 through the package substrate 820. The connections 833 can represent electrical paths formed through the package substrate 820, such as connections associated with vias and conductors of a multilayer laminated-package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 12:
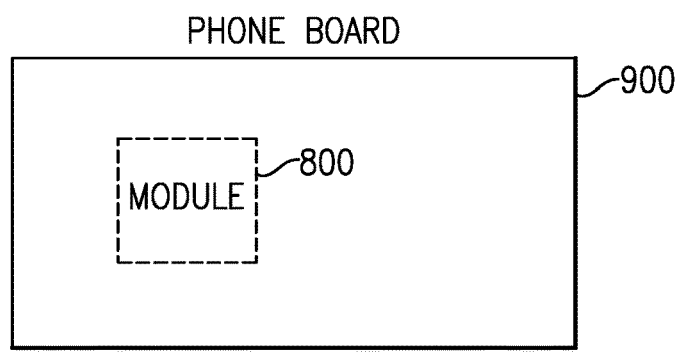
FIG. 12 illustrates a schematic diagram of one example of a phone board.

FIG. 12 is a schematic diagram of one embodiment of a phone board 900. The phone board 900 includes the module 800 shown in FIGS. 10A-10B attached thereto. Although not illustrated in FIG. 12 for clarity, the phone board 800 can include additional components and structures.

Applications

Some of the examples described above have been provided in connection with wireless devices or mobile phones. However, the principles and advantages of the embodiments can be used for any other systems or apparatus that have needs for power amplifiers.

Such power amplifier systems can be implemented in various electronic devices. Examples of the electronic devices can include, but are not limited to, consumer electronic products, parts of the consumer electronic products, electronic test equipment, and so forth Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, and so forth Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein such as among others, "can," "could," "might," "can," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the disclosure is not intended to be exhaustive or to limit the disclosure to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the disclosure provided herein can be applied to other systems, not necessarily the system described above. The elements and acts of the various embodiments described above can be combined to provide further embodiments.

While certain embodiments of the disclosure have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   an amplifying transistor configured to amplify a radio frequency signal;
   a bias circuit configured to provide a bias voltage to the amplifying transistor; and
   a clamp circuit for protecting the power amplifier system by absorbing a current flowing through the amplifying transistor when the clamp circuit is switched on, the clamp circuit being connected at a bias node between the bias circuit and the amplifying transistor and including a clamp transistor and a clamp diode, the clamp diode having one end connected to a collector of the clamp transistor at the bias node and another end connected to a base of the clamp transistor.

2. The power amplifier system of claim 1 wherein the clamp circuit is configured to prevent a current from flowing into the clamp circuit when the clamp circuit is switched off.

3. The power amplifier system of claim 1 wherein the clamp circuit is configured to be switched on when a bias voltage exceeds a threshold voltage.

4. The power amplifier system of claim 1 wherein the collector of the clamp transistor is connected between the bias node at which the bias voltage is provided and a ground.

5. The power amplifier system of claim 1 wherein the bias node is connected to a base of the amplifying transistor via a resistor.

6. The power amplifier system of claim 1 further comprising a voltage supply circuit configured to provide a supply voltage to the power amplifier system, the supply voltage having stepwise values that change periodically in relation to an output power of the power amplifier system.

7. The power amplifier system of claim 1 further comprising a diode stack circuit including a plurality of diodes, the diode stack circuit connected between a collector of the amplifying transistor and an emitter of the amplifying transistor.

8. The power amplifier system of claim 7 wherein the diode stack circuit includes a plurality of diodes connected in series, a single diode connected in parallel and in opposite direction to the plurality of diodes, and a capacitor connected in parallel to the plurality of diodes.

9. A radio frequency module comprising:
   a packaging substrate configured to receive a plurality of components; and
   a power amplifier system implemented on the packaging substrate, the power amplifier system including an amplifying transistor configured to amplify a radio frequency signal, a bias circuit configured to provide a bias voltage to the amplifying transistor, and a clamp circuit for absorbing a current flowing through the amplifying transistor when the clamp circuit is switched on, the clamp circuit being connected at a bias node between the bias circuit and the amplifying transistor and including a clamp transistor and a clamp diode, the clamp diode having one end connected to a collector of the clamp transistor at the bias node and another end connected to a base of the clamp transistor.

10. The radio frequency module of claim 9 wherein the radio frequency module is a front-end module.

11. The radio frequency module of claim 9 wherein the clamp circuit is configured to prevent a current from flowing into the clamp circuit when the clamp circuit is switched off.

12. The radio frequency module of claim 11 wherein the clamp circuit is configured to be switched on when a bias voltage exceeds a threshold voltage.

13. The radio frequency module of claim 12 wherein the power amplifier system further includes a diode stack circuit including a plurality of diodes, the diode stack circuit connected between a collector of the amplifying transistor and an emitter of the amplifying transistor.

14. The radio frequency module of claim 13 wherein the diode stack circuit includes a plurality of diodes connected in series, a single diode connected in parallel and in opposite direction to the plurality of diodes, and a capacitor connected in parallel to the plurality of diodes.

15. The radio frequency module of claim 9 wherein the collector of the clamp transistor is connected between the bias node at which the bias voltage is provided and a ground.

16. The radio frequency module of claim 9 wherein the bias node is connected to a base of the amplifying transistor via a resistor.

17. The radio frequency module of claim 9 wherein the power amplifier system further includes a voltage supply circuit configured to provide a supply voltage to the power amplifier system, the supply voltage having stepwise values that change periodically in relation to an output power of the power amplifier system.

18. The radio frequency module of claim 9 wherein the power amplifier system further includes a diode stack circuit including a plurality of diodes, the diode stack circuit connected between a collector of the amplifying transistor and an emitter of the amplifying transistor.

19. The radio frequency module of claim 18 wherein the diode stack circuit includes a plurality of diodes connected in series, a single diode connected in parallel and in opposite direction to the plurality of diodes, and a capacitor connected in parallel to the plurality of diodes.

20. The radio frequency module of claim 9 wherein the clamp circuit is configured to be switched on when a bias voltage exceeds a threshold voltage.

* * * * *